(12) United States Patent
Asano et al.

(10) Patent No.: US 8,121,387 B2
(45) Date of Patent: Feb. 21, 2012

(54) MASK PATTERN VERIFYING METHOD

(75) Inventors: Mitsuyo Asano, Yokohama (JP); Shinji Yamaguchi, Tokyo (JP); Satoshi Tanaka, Kawasaki (JP); Soichi Inoue, Yokohama (JP); Masamitsu Itoh, Yokohama (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1007 days.

(21) Appl. No.: 12/052,066

(22) Filed: Mar. 20, 2008

(65) Prior Publication Data
US 2008/0232671 A1 Sep. 25, 2008

(30) Foreign Application Priority Data
Mar. 22, 2007 (JP) ................. 2007-075482

(51) Int. Cl.
*G06Q 10/00* (2006.01)
(52) U.S. Cl. ....................................... 382/141
(58) Field of Classification Search .................. None
See application file for complete search history.

(56) References Cited

U.S. PATENT DOCUMENTS

| | | | |
|---|---|---|---|
| 6,649,310 B2 | 11/2003 | Itoh et al. | |
| 6,772,089 B2 | 8/2004 | Ikeda et al. | |
| 7,090,949 B2 | 8/2006 | Nojima et al. | |
| 7,313,781 B2 | 12/2007 | Asano et al. | |
| 2005/0238221 A1* | 10/2005 | Hirano et al. | 382/144 |
| 2007/0150850 A1 | 6/2007 | Itoh | |
| 2008/0028361 A1 | 1/2008 | Yamanaka et al. | |

FOREIGN PATENT DOCUMENTS

| | | |
|---|---|---|
| JP | 9-34095 | 2/1997 |
| JP | 2003-216959 | 7/2003 |
| JP | 2004-30368 | 1/2004 |
| JP | 2004-157475 | 6/2004 |
| JP | 2006-14292 | 1/2006 |
| JP | 2006-23649 | 1/2006 |

OTHER PUBLICATIONS

Kenji Yoshida et al., "Pattern Management Method and Pattern Management Program," U.S. Appl. No. 11/958,465, filed Dec. 18, 2007.
Final Notice of Rejection issued by the Japanese Patent Office on May 18, 2010, for Japanese Patent Application No. 2007-075482, and English-language translation thereof.
Iba et al., "Electrical Characterization of Across-Field Lithographic Performance for 256M bit DRAM Technologies," SPIE (1995), pp. 218-225.
Notice of Reasons for Rejection issued by the Japanese Patent Office on Aug. 25, 2009, for Japanese Patent Application No. 2007-0754852, and English-language translation thereof.

* cited by examiner

*Primary Examiner* — Tu Nguyen
(74) *Attorney, Agent, or Firm* — Finnegan, Henderson, Farabow, Garrett & Dunner, L.L.P.

(57) ABSTRACT

A mask pattern verifying method include obtaining first information about a hot spot from design data of a mask pattern, obtaining second information about the mask pattern actually formed on a photo mask, and determining a measuring spot of the mask pattern actually formed on the photo mask, based on the first and second information.

15 Claims, 13 Drawing Sheets

| No. | X | Y | Pattern failure category | MEF |
|---|---|---|---|---|
| 1 | 11320.300 | -42446.197 | Short 65nm @ under-dose | 1.6 |
| 2 | 20833.225 | -23862.409 | Open 65nm @ over-dose | 1.4 |
| ... | ... | ... | | |
| 9 | 2558.963 | 2240.778 | Open 65nm @ over-dose | 2.2 |
| 10 | 5263.762 | 2240.778 | Short 70nm @ under-dose | 1.3 |
| 11 | 3622.413 | 2121.174 | Short 70nm @ under-dose | 1.4 |
| 12 | 917.613 | 2121.174 | Short 70nm @ under-dose | 1.2 |
| ... | ... | ... | | |
| 23 | 42467.062 | -41248.220 | Short 75nm @ under-dose | 3.5 |
| 24 | 33627.097 | -47162.257 | Open 75nm @ defocused | 1.2 |
| ... | ... | ... | | |

F I G. 11

| No. | X | Y | Pattern failure category | MEF | ΔP[nm] |
|---|---|---|---|---|---|
| 1 | 11320.300 | -42446.197 | Short 65nm @ under-dose | 1.6 | 2.2 |
| 2 | 20833.225 | -23862.409 | Open 65nm @ over-dose | 1.4 | 3.3 |
| ⋮ | ⋮ | ⋮ | | | |
| 9 | 2558.963 | 2240.778 | Open 65nm @ over-dose | 2.2 | 1.3 |
| 10 | 5263.762 | 2240.778 | Short 70nm @ under-dose | 1.3 | -2.4 |
| 11 | 3622.413 | 2121.174 | Short 70nm @ under-dose | 1.4 | 3.2 |
| 12 | 917.613 | 2121.174 | Short 70nm @ under-dose | 1.2 | -3.1 |
| ⋮ | ⋮ | ⋮ | | | |
| 23 | 42467.062 | -41248.220 | Short 75nm @ under-dose | 3.5 | -6.4 |
| 24 | 33627.097 | -47162.257 | Open 75nm @ defocused | 1.2 | 2.1 |
| ⋮ | ⋮ | ⋮ | | | |

FIG. 12

| No. | X | Y | Pattern failure category | MEF | ΔP[nm] | Estimated resolution dimension on wafer |
|---|---|---|---|---|---|---|
| 1 | 11320.300 | -42446.197 | Short 65nm @ under-dose | 1.6 | 2.2 | Short 64nm @ under-dose |
| 2 | 20833.225 | -23862.409 | Open 65nm @ over-dose | 1.4 | 3.3 | Open 66nm @ over-dose |
| 9 | 2558.963 | 2240.778 | Open 65nm @ over-dose | 2.2 | 1.3 | Open 66nm @ over-dose |
| ⋮ | ⋮ | ⋮ | ⋮ | | | |
| 11 | 3622.413 | 2121.174 | Short 70nm @ under-dose | 1.4 | 3.2 | Short 69nm @ under-dose |
| 23 | 42467.062 | -41248.220 | Short 75nm @ under-dose | 3.5 | 6.4 | Short 69nm @ under-dose |
| 10 | 5263.762 | 2240.778 | Short 70nm @ under-dose | 1.3 | -2.4 | Short 71nm @ under-dose |
| 12 | 917.613 | 2121.174 | Short 70nm @ under-dose | 1.2 | -3.1 | Short 71nm @ under-dose |
| ⋮ | ⋮ | ⋮ | ⋮ | | | |
| 24 | 33627.097 | -47162.257 | Open 75nm @ defocused | 1.2 | 2.1 | Open 76nm @ defocused |
| ⋮ | ⋮ | ⋮ | ⋮ | | | |

F I G. 13

| No. | X | Y | Pattern failure category |
|---|---|---|---|
| 1 | 11,320.300 | −42,446.197 | Short @ under-dose |
| 2 | 20,833.225 | −23,862.409 | Open @ over-dose |
| 3 | 42,467.062 | −41,248.220 | Open @ over-dose |
| 4 | 33,627.097 | −47,162.257 | Open @ over-dose |
| ... | ... | ... | |

FIG. 16

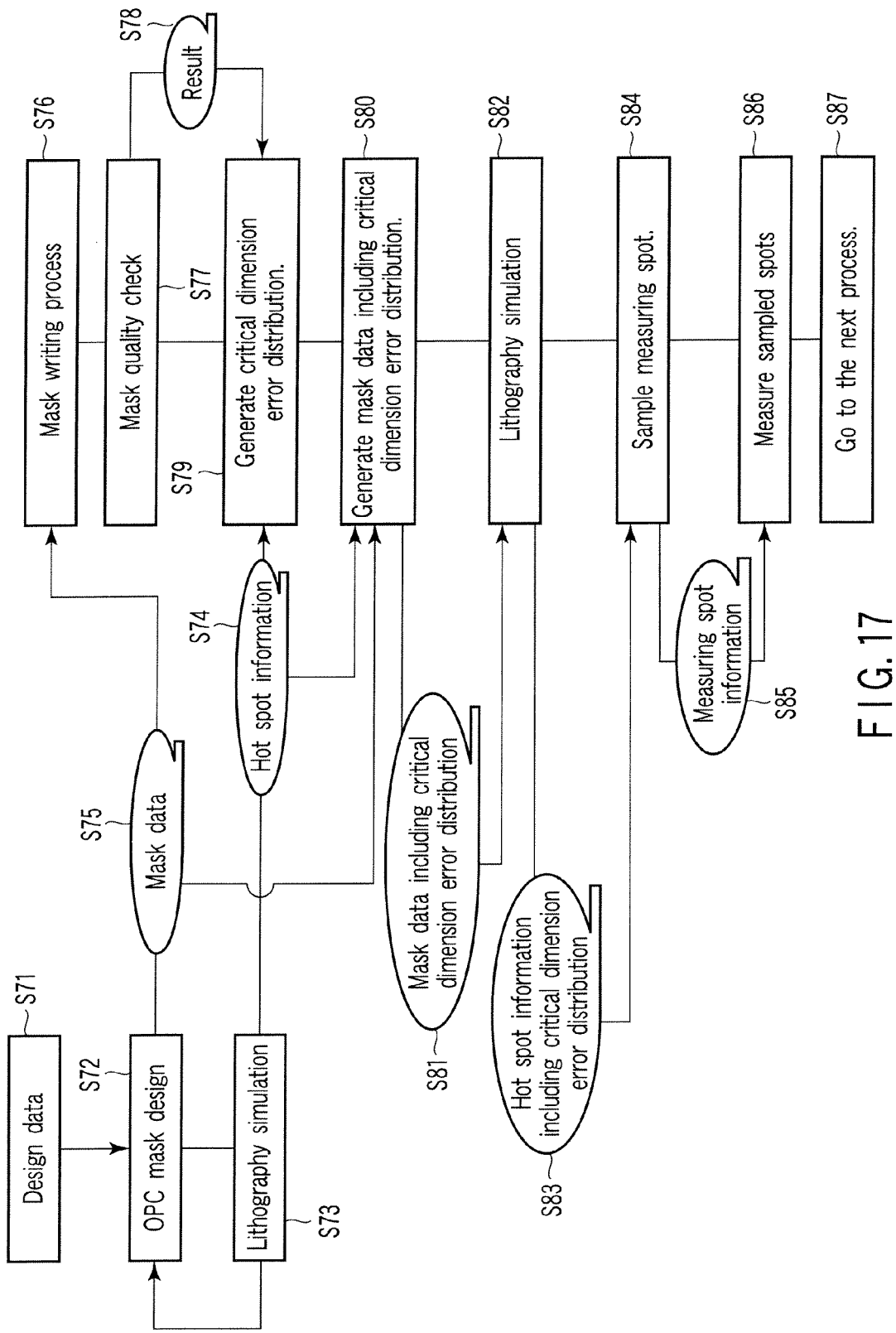
F I G. 17

MASK PATTERN VERIFYING METHOD

CROSS-REFERENCE TO RELATED APPLICATIONS

This application is based upon and claims the benefit of priority from prior Japanese Patent Application No. 2007-075482, filed Mar. 22, 2007, the entire contents of which are incorporated herein by reference.

BACKGROUND OF THE INVENTION

1. Field of the Invention

The present invention relates to a mask pattern verifying method.

2. Description of the Related Art

As a design of a semiconductor device has become finer, various resolution enhancement technologies have been developed. By optical proximity correction (OPC) technology, one of these technologies, a shape of a mask pattern has become complex. Therefore, management of a pattern considering a two-dimensional shape has been demanded. For example, in the method disclosed in Jpn. Pat. Appln. KOKAI Publication No. 2006-14292, a contour of a mask pattern is extracted from an image of a mask pattern obtained by an image acquisition apparatus such as a scanning electron microscope (SEM), and a mask pattern is evaluated by using the obtained contour data.

When a contour of a mask pattern is extracted from a mask pattern image, the edge is detected at fine edge-searching intervals to exactly trace the complicated shape. This increases the amount of contour data, requiring a long time for processing the contour data.

Further, a hot spot is caused by a problem in resolution upon exposition as a mask pattern becomes finer and complex. A hot spot is usually obtained by lithography simulation, and a spot with a small lithography process latitude is detected as a hot spot.

In lithography simulation to detect a hot spot, it is assumed that a mask pattern is exactly formed as is designed. However, an actually formed mask pattern includes various error factors (fluctuation factors). Thus, a spot judged not a hot spot in lithography simulation sometimes actually becomes a hot spot.

As described above, the amount of pattern contour data is increased in the prior art, and a hot spot in a pattern is not exactly defined. Therefore, there is a problem that pattern information such as a pattern contour and a hot spot in a pattern is not correctly generated.

BRIEF SUMMARY OF THE INVENTION

An aspect of the present invention, there is provided a mask pattern verifying method comprising: obtaining first information about a hot spot from design data of a mask pattern; obtaining second information about the mask pattern actually formed on a photo mask; and sampling a measuring spot of the mask pattern actually formed on the photo mask, based on the first and second information.

BRIEF DESCRIPTION OF THE SEVERAL VIEWS OF THE DRAWING

FIG. 11 is a diagram showing information about a hot spot, according to the fourth embodiment of the invention;

FIG. 12 is a diagram showing information about a hot spot, according to the fourth embodiment of the invention;

FIG. 13 is a diagram showing information about a hot spot, according to the fourth embodiment of the invention;

FIG. 16 is a diagram showing information about a hot spot, according to a sixth embodiment of the invention; and FIG. 17 is a flowchart showing a seventh embodiment of the invention.

DETAILED DESCRIPTION OF THE INVENTION

Hereinafter, the embodiments of the invention will be explained with reference to the accompanying drawings.

Embodiment 1

Figure 1:
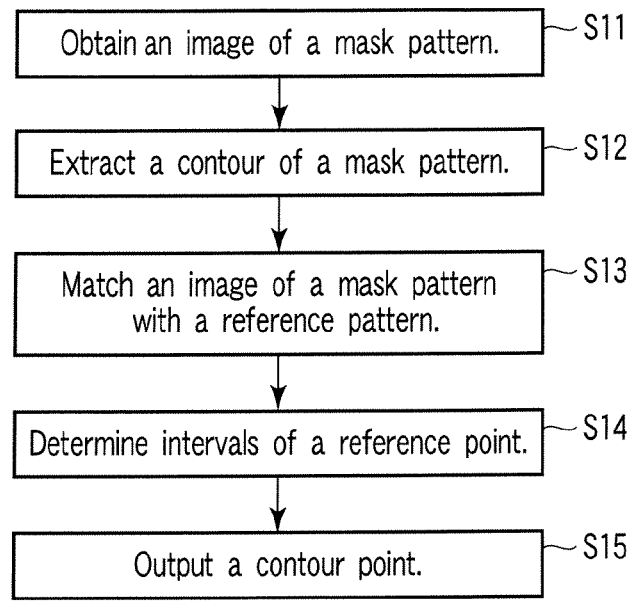
FIG. 1 is a flowchart showing a first embodiment of the invention.

FIG. 1 is a flowchart showing a first embodiment of the invention.

Figure 2:
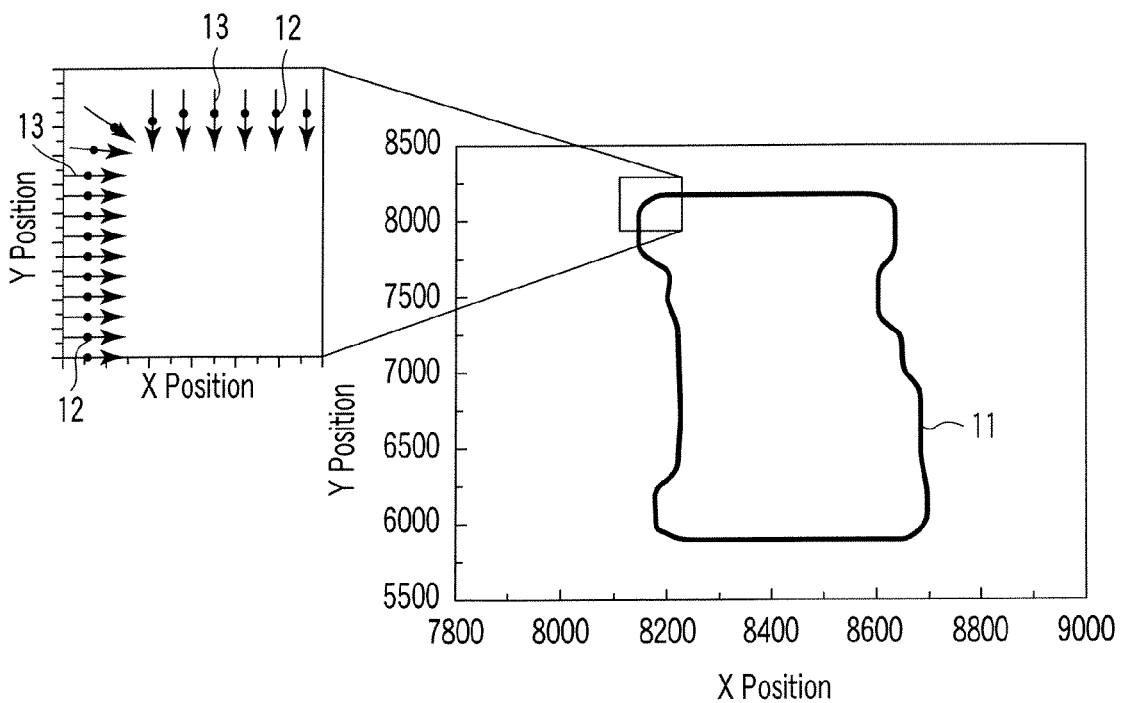
FIG. 2 is a diagram showing a contour, etc. of a mask pattern image, according to the first embodiment of the invention.

First, an image of a mask pattern to be evaluated is obtained (S11). Then, a contour of a mask pattern is obtained from the obtained image (S12). By using a scanning electron microscope (SEM) as an image acquisition apparatus, a contour of a mask pattern is detected by a threshold method. When there are two or more graphics in the obtained image, the obtained contour data is divided into groups for each of the graphics. Further, contour points are arranged in a certain direction (e.g., in a clockwise direction) for each of the graphics, and the contour is made polygonal. In the detection of the contour of a pattern by the threshold method, contour points are usually detected by changing a searching direction according to the shape of the pattern. This information of the contour point searching direction will be used in a later process. Therefore, the information of the contour point searching direction is stored as intermediate processing data together with the information about the detected contour points. FIG. 2 is a diagram showing a contour 11 of the above-mentioned mask pattern image, a contour point 12, and a contour point searching direction 13.

Next, a mask pattern image is matched with a reference pattern (S13). Namely, the obtained contour data is matched with reference data. In this embodiment, mask design data is used as reference data. Concretely, optical proximity corrected (OPC) mask design data is used. The matching process is performed to obtain the highest the degree of coincidence of a diagram 11 formed from the contour data of a mask pattern image and a diagram formed by connecting vertex 14 of the mask design data, as shown in FIG. 3.

Figure 3:
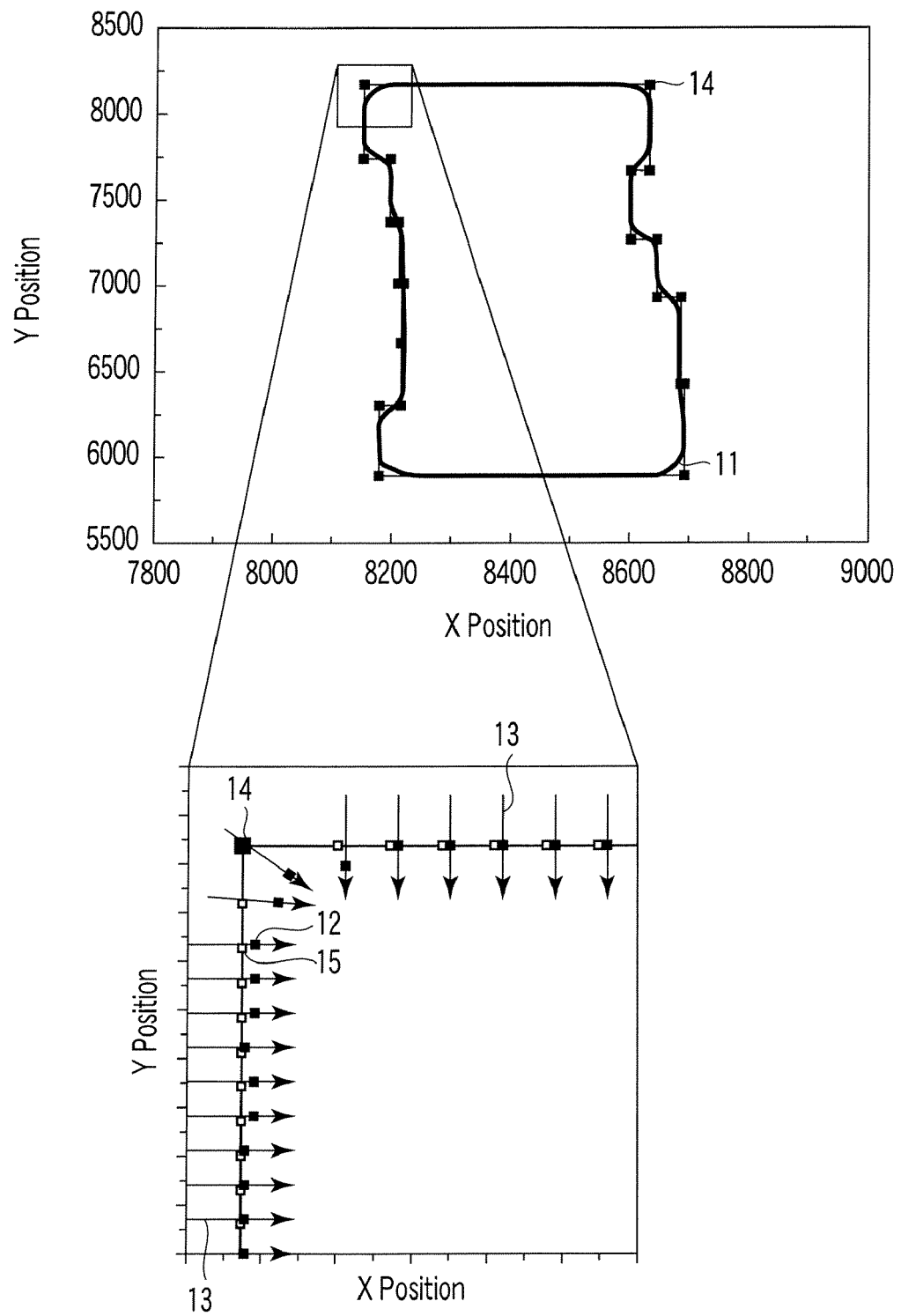
FIG. 3 is a diagram showing a matching process, according to the first embodiment of the invention.

Then, as shown in FIG. 3, an intersection of a ling segment connecting the vertex 14 of the mask design data (reference data) and a line segment indicating the contour point searching direction 13 is defined as a corresponding point 15 of the pattern contour point 12 in the mask design data.

Next, a reference point is set on the contour of a reference pattern at intervals according to the distance from the vertex (a closest vertex) of the reference pattern (reference data) (S14). Namely, an appropriate point in the corresponding point 15 is selected as a reference point. Concretely, a distance x from each corresponding point 15 to the most close vertex 14 in the reference pattern is obtained, and a reference point interval d is obtained as a function of the distance x. In this embodiment, a reference point is set based on the following equation (1).

$$d = A1 \times \exp(x/t1) \quad (1)$$

Here, A1 and t1 are coefficients. As obvious from the equation (1), the reference point interval d is increased as the corresponding point comes farther from the vertex 14 of the reference pattern.

Then, a contour point of the mask pattern image is output at a position defined by the above reference point (S15). Namely, a contour point corresponding to each reference point is output. Therefore, the contour point output interval set as above has the tendency similar to the interval of a reference point (the interval is increased as the corresponding point comes farther from the vertex). In this embodiment, an averaging process is performed when a contour point is output. Namely, the coordinates (x/y coordinates) of contour points close to the output contour point (the contour points extracted in step S12) are averaged, and the coordinates (x/y coordinates) of the output contour point are calculated. By executing such an averaging process, fine unevenness in the contour (edge) caused by a noise of an image can be prevented.

Figure 4:
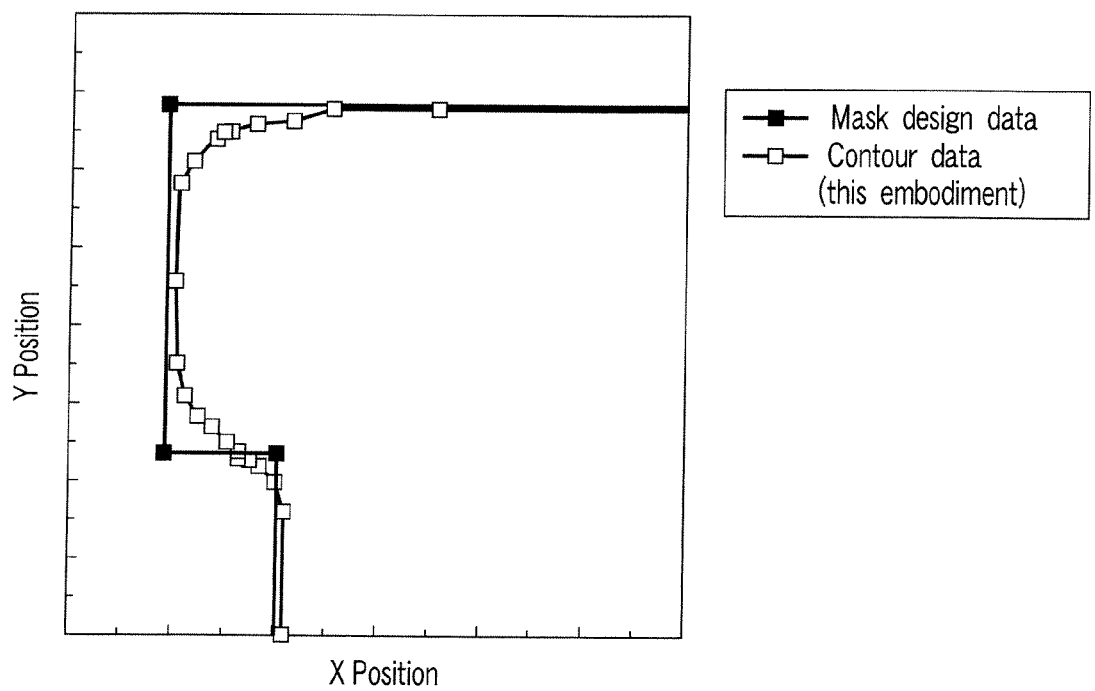
FIG. 4 is a diagram showing contour points set by a method of the first embodiment of the invention.
Figure 5:
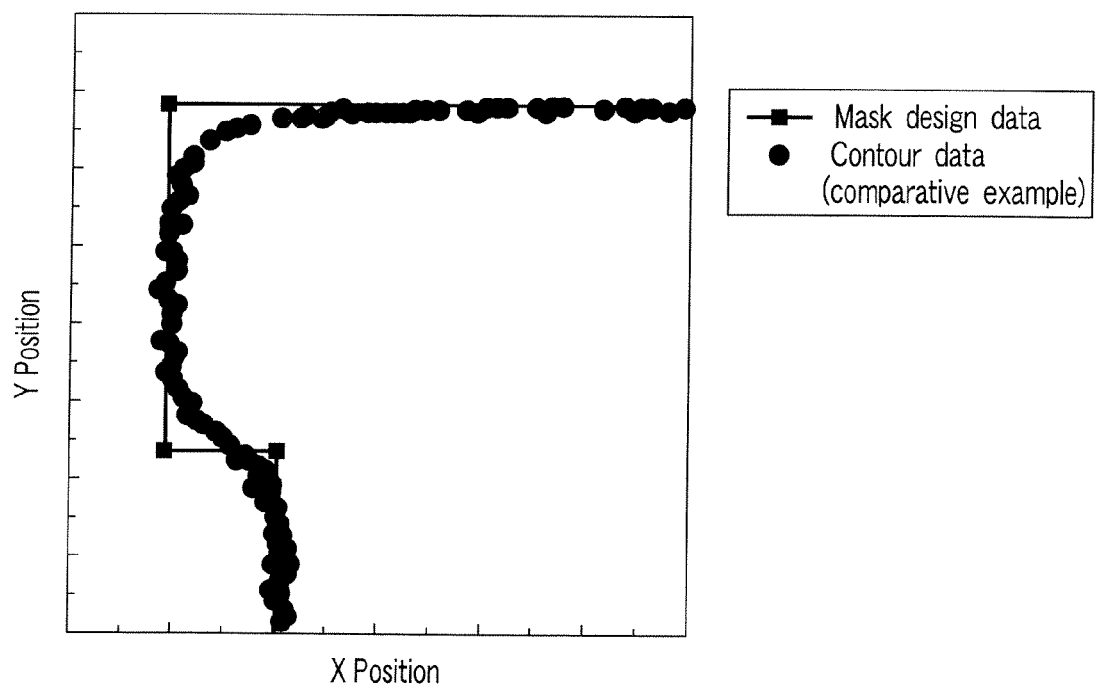
FIG. 5 is a diagram showing contour points set by a comparative method of the first embodiment of the invention.

FIG. 4 is a diagram showing contour points set by the method of this embodiment. FIG. 5 is a diagram showing contour points set by a conventional (comparative) method. In the conventional method, contour points are set at equal intervals. As seen from these diagrams, by setting contour points by the method of this embodiment, the number of contour points can be largely decreased.

Further, as shown in FIG. 4, alienation between an output contour point and a mask design pattern (a reference pattern) becomes large near the vertex of the mask design pattern. Therefore, in a part close to the vertex of the mask design pattern, it is necessary to minutely trace the contour of a mask pattern image. In the method of this embodiment, as seen from FIG. 4, the intervals of the output contour point become narrow at a position close to the vertex of the mask design pattern. Therefore, necessary trace accuracy can be ensured, and the amount of contour data can be decreased.

As explained above, according to this embodiment, the contour of a mask pattern image can be accurately expressed by small amount of data. Therefore, when lithography simulation is performed by using the contour data obtained by the method of this embodiment, accurate simulation can be performed in a short time.

Next, a modification of this embodiment will be explained.

In the above embodiment, a reference point is set at an interval according to the distance from the vertex of the reference pattern in step S14 of FIG. 1, and a contour point is output onto the contour of a mask pattern image according to each reference point in step S15. However, it is allowed to set a contour point of a mask pattern image at an interval according to the distance between the contour of a mask pattern image and the contour of a reference pattern. Concretely, as shown in FIG. 3, the contour point 12 and the corresponding point 15 in the mask design data is obtained, and the distance between the contour point 12 and a reference pattern means the distance between the contour pint 12 and its corresponding point 15. In step S14, a reference point is set on the contour of a reference pattern at intervals according to the distance between the contour of a mask pattern image and the contour of a reference pattern. In step S15, a contour point is output on the contour of a mask pattern image corresponding to each reference point.

As described hereinbefore, alienation between the contour of a mask pattern image and the contour of a reference pattern is large near the vertex of a reference pattern (refer to FIG. 4). It is necessary to minutely trace the contour of a mask pattern image near the vertex of a reference pattern. Therefore, as in this modification, it is possible to obtain the similar effect as that in the embodiment described hereinbefore, if a contour point of a mask pattern image is set at intervals according to the distance between the contour of a mask pattern image and the contour of a reference pattern. Namely, the contour of a mask pattern image can be expressed with small amount of data, and accurate simulation can be executed in a short time.

It is allowed to use both of the methods of the embodiment and modification described above. Namely, it is allowed to set intervals for a reference point and contour point, according to the distance from the vertex of a reference pattern and the distance between the contour of a mask pattern image and the contour of a reference pattern.

Embodiment 2

A second embodiment of the invention will be explained hereinafter. The basic matters are the same as in the first embodiment, and explanations about these matters will be omitted.

In the first embodiment, a mask design pattern (mask design data) is used as a reference pattern (reference data). In the second embodiment, a mask writing shot pattern (mask writing shot data) is used as a reference pattern (reference data). A basic flow of this embodiment is the same as the flow shown in FIG. 1 of the first embodiment, and detailed explanation about the flow will be omitted.

Generally, in mask pattern writing by using an electron beam, a mask pattern is formed by combining a square or polygonal beam shot called VSB (Variable Shaped Beam). A VSB shot position shifts because of a problem in a writing apparatus, and a position shift error occurs. This position shift error may become a problem in an exposing process. To evaluate the influence of a position shift error, contour data of an actually formed mask pattern may be used as an input data for lithography simulation.

Figure 6A:
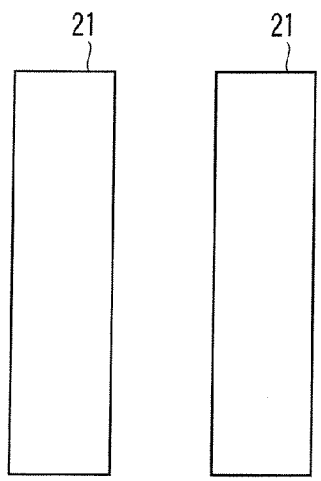
FIGS. 6A to 6C are diagrams showing a mask drawing shot pattern, according to a second embodiment of the invention.
Figure 6B:
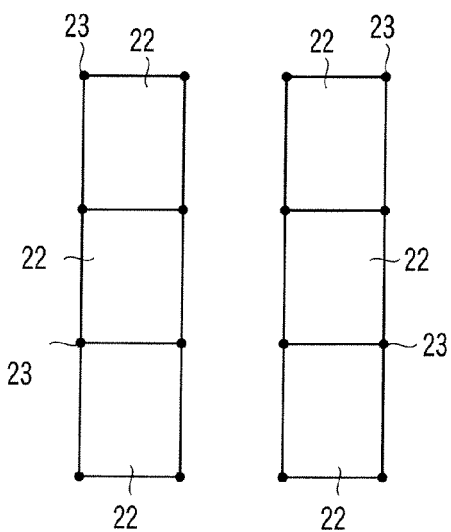
Figure 6C:
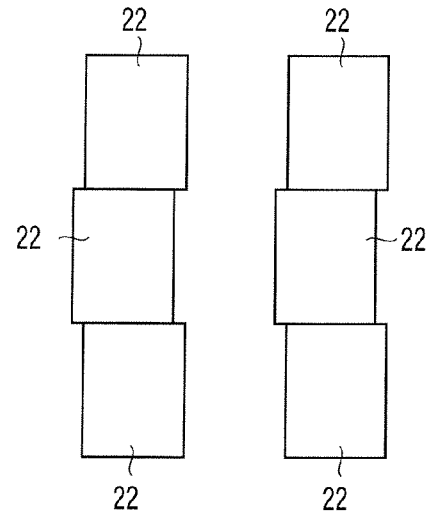

FIGS. 6A to 6C are diagrams showing a mask writing shot pattern. FIG. 6A shows a design pattern (design data) 21. FIG. 6B shows a mask writing shot pattern (mask writing shot data) 22. FIG. 6C shows a shift in the mask writing shot pattern 22.

As shown in FIG. 6C, when a position shift error occurs during a mask writing, it is necessary to minutely trace a position near the point where the position shift error occurs. Therefore, in this embodiment, a vertex 23 (refer to FIG. 6B) of a mask writing shot 22 is handled in the same way as the vertex 14 in the first embodiment (refer to FIG. 3), and the same method as that shown in the first embodiment is applied.

Figure 7:
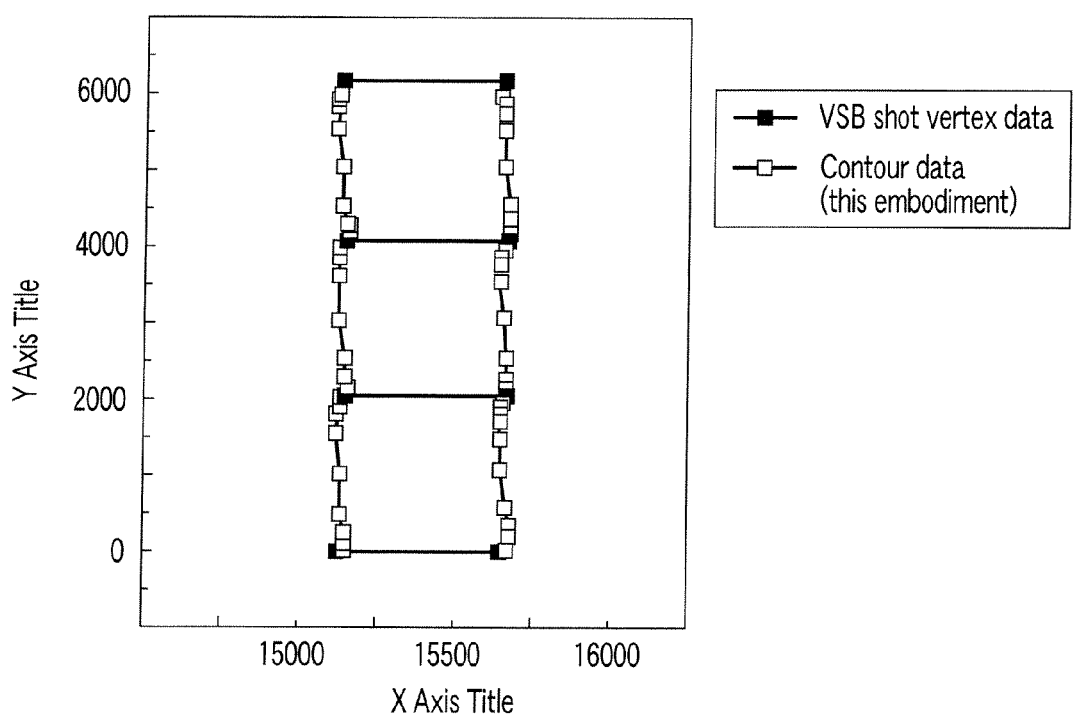
FIG. 7 is a diagram showing contour points set by the method of the second embodiment of the invention.
Figure 8:
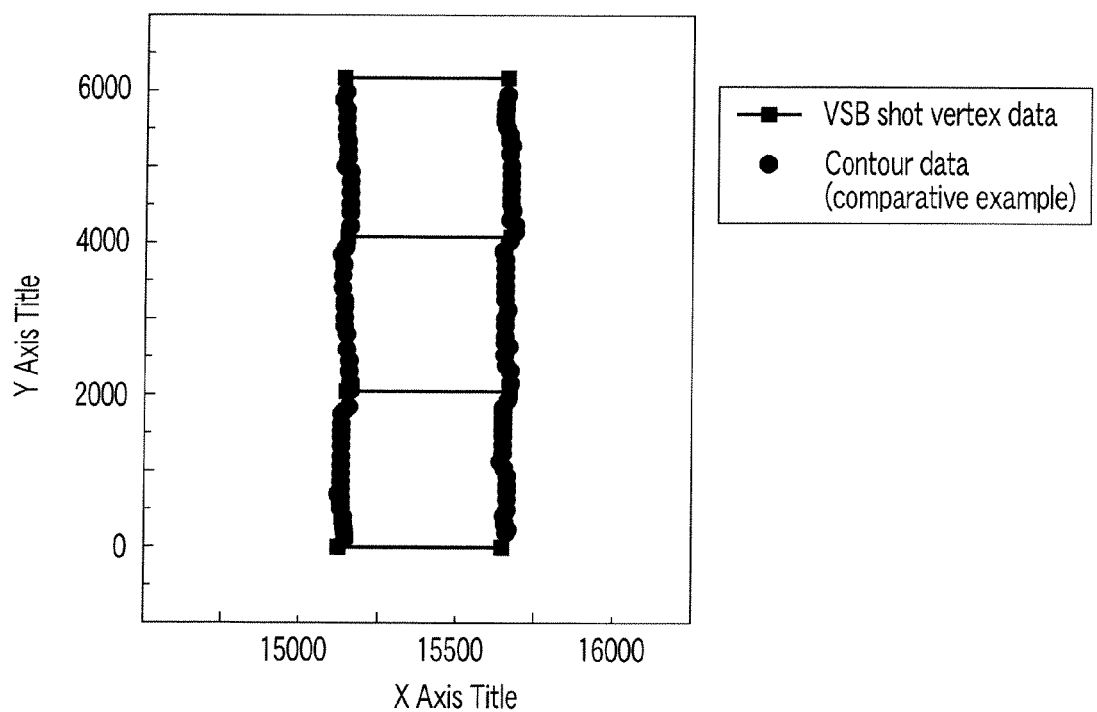
FIG. 8 is a diagram showing contour points set by a comparative method of the second embodiment of the invention.

FIG. 7 is a diagram showing contour points set by the method of this embodiment. FIG. 8 is a diagram showing contour points set by a conventional (comparative) method. In the conventional method, contour points are set at equal intervals. As seen from these drawings, the number of contour points can be largely decreased by setting contour points by the method of this embodiment. As shown in FIG. 7, in the method of this embodiment, the interval between output contour points is narrowed at a position near the vertex of the mask writing shot pattern (reference pattern).

In this embodiment, as in the first embodiment, the contour of a mask pattern image can be accurately expressed with small amount of data. Therefore, when lithography simulation is performed by using the contour data obtained by the method of this embodiment, the simulation can be accurately performed in a short time.

It is possible in this embodiment to adopt a method similar to the method described in the modification of the first embodiment. Namely, contour points of a mask pattern image may be set at intervals according to the distance between the contour of a mask pattern image and the contour of a reference pattern (mask writing shot pattern). In this case, also, the contour of a mask pattern image can be accurately expressed with small amount of data, and accurate simulation can be performed within a short time.

Embodiment 3

A third embodiment of the invention will be explained hereinafter. The basic matters are the same as in the first embodiment, and explanations about these matters will be omitted.

Figure 9:
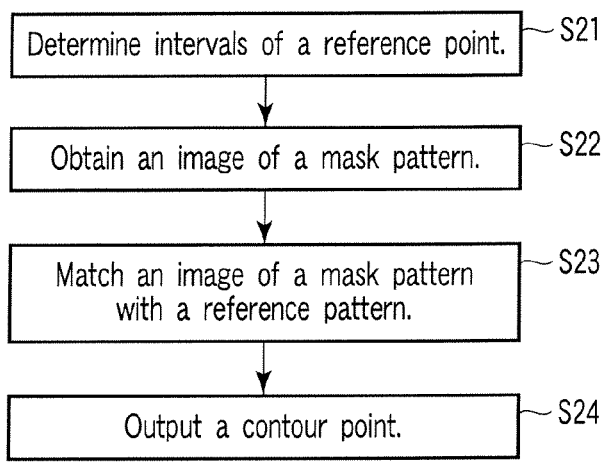
FIG. 9 is a flowchart showing a third embodiment of the invention.

FIG. 9 is a flowchart showing the third embodiment.

In this embodiment, first, a reference point is set on the contour of a reference pattern at intervals according to the distance from the vertex (a closest vertex) of a reference pattern (reference data) (S21). A concrete method is the same as the first embodiment.

Then, an image of a mask pattern to be evaluated is obtained, as in the first embodiment (S22). Further, the mask pattern image is matched with a reference pattern (S23). Various algorithms have been proposed for matching the mask pattern image with a reference pattern. Generally, to capture the amount of characteristics of an image, a method of extracting the contour of a mask pattern image is used. However, in the contour extraction is this step, it is sufficient to obtain the amount of characteristics for the matching, and the accuracy necessary for measuring a shape is not required. Further, the contour data needs not to be divided into groups for each graphics, and a contour point needs not to be made polygonal.

Then, a contour point of a mask pattern image at a position defined by a reference point is extracted, and the extracted point is used as an output point (S24). Namely, contour points of a mask pattern image are extracted corresponding to each reference point.

As above described, the contour of a mask pattern image can be accurately expressed with small amount of data in this embodiment, as in the first embodiment. Therefore, when lithography simulation is performed by using the contour data obtained by the method of this embodiment, the simulation can be accurately performed in a short time. Further, as a reference point is previously set, the step of extracting the contour of a mask pattern image (S12 in FIG. 1 shown in the first embodiment) can be omitted. Therefore, the processing time can be reduced.

Embodiment 4

Figure 10:
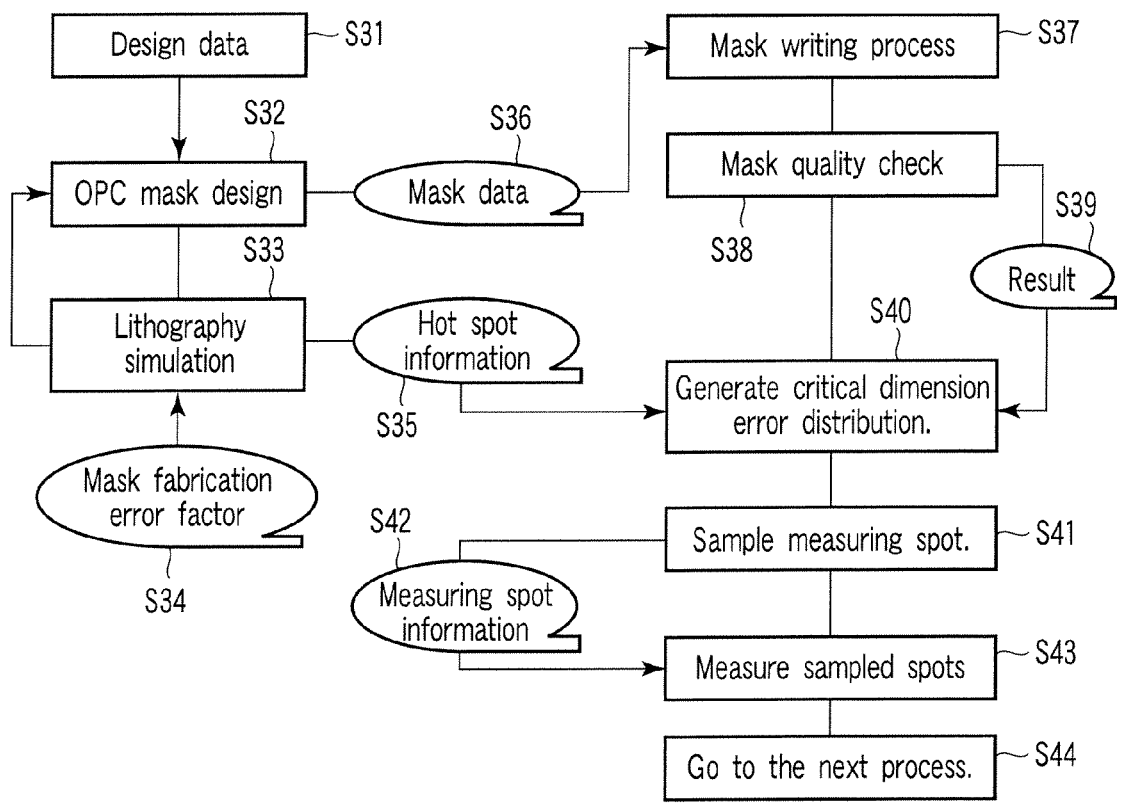
FIG. 10 is a flowchart showing a fourth embodiment of the invention.

FIG. 10 is a flowchart showing the fourth embodiment.

First, design data (design pattern) is prepared (S31), a mask considering OPC is designed based on the design data (S32), and lithography simulation is performed (S33). A mask fabrication error factor is considered in the lithography simulation (S34), and hot spot information can be obtained in the lithography simulation (S35). Generally, a hot spot has small lithography process latitude, and a pattern error occurs easily. At a hot spot, a pattern shape error becomes large because of various error factors. Error factors include errors caused by data processing (OPC residual error, etc.), errors caused by a mask (an average pattern dimension value, a pattern dimension variance, transmittance, phase, a mask corner shape, a mask sectional shape, etc.), errors caused by an exposing apparatus (focus, exposure dose, aberration, apodization, scan synchronization accuracy, light source wavelength variance, flare, distribution of degree of polarization, etc.), errors caused by a track (uniformity of multi-layer film on a wafer, PAB, PEB temperature, etc.), and errors caused by etching (coating ratio, process conversion difference error, etc.). A hot spot also occurs at a position where optical proximity correction (OPC) is insufficient, and the amount of deviation from a desired dimension or shape is large. Steps S32 to S35 will be explained in detail hereinafter.

As a method of designing a mask considering variation in the specifications of a mask, there has been proposed a method, which performs lithography simulation including the specification value of a mask such as dimensions, transmittance and phase difference, upon verification of a mask pattern on which an OPC pattern is placed (Jpn. Pat. Appln. KOKAI Publication No. 2004-157475). In this embodiment, lithography simulation is performed based on this method. Concretely, in addition to lithography simulation when a mask pattern size is as designed, lithography simulation is performed also when a mask pattern size is fluctuated by $\Delta Lm$. Therefore, it is possible to know the degree of influence of fluctuation $\Delta Lw$ of the pattern size on a wafer when the mask pattern size is fluctuated by $\Delta Lm$, in addition to knowing a position which becomes a hot spot. This degree of influence is output as MEF (Mask Error Enhancement Factor, $MEF = m \times \Delta Lw / \Delta Lm$, m: mask magnification) (J. Iba, et. al. "Electrical Characterization of Across-field Lithographic Performance for 256-Mbit DRAM technologies", Proc. SPIE, pp. 218-225, 1995).

FIG. 11 is a diagram showing hot spot information obtained in a photo mask data designing stage. Hot spot information includes coordinates (X, Y), pattern failure category, and MEF. At this time, the coordinates (X, Y) are arranged in the order of potential to fail when a mask pattern is formed as is designed. The hot spot information shown in FIG. 11 is sent to a mask manufacturing process.

Mask data is generated from OPC mask design data (S36), a mask writing process is executed based on the generated data, and a developing process and an etching process are executed (S37). A mask quality check is executed for a photo mask formed as described above (S38). In the mask quality check, a dimension and shape of a mask pattern are measured. As for a phase shift mask, a phase difference and transmittance are also measured. Hereinafter, a concrete example of a mask quality check will be explained.

In dimension measurement in a mask manufacturing process, a dimension is measured at multipoint on a photo mask. In this embodiment, an optical dimension-measuring device is used, and 100 space patterns are selected as a measuring pattern. Based on the result of measurement, an average value and variance of the difference between a critical dimension and a desired dimension (e.g., mask design dimension) are obtained. Concretely, the difference $\Delta P$ between a critical dimension and a desired dimension is obtained at each dimension-measuring position. And, distribution of ΔP is obtained as a function of XY coordinates on the mask surface. Namely, the following function is obtained.

$$\Delta p = f(X, Y)$$

This function is called a critical dimension error distribution, and the ΔP of each coordinate is called a critical dimension error value.

Then, a critical dimension error distribution is generated (S40), based on the XY coordinates of hot spot information (S35) obtained in step S33 and the critical dimension error distribution obtained in steps S38 and S39. Concretely, as shown in FIG. 12, the value of ΔP is obtained for each coordinate (hot spot).

Further, as the pattern failure information and MEF value have been obtained in the mask data designing stage, a fluctuation in the dimension of a pattern to be transferred onto a wafer can be estimated by using the critical dimension error value ΔP obtained in the mask check process (refer to FIG. 13). For example, assuming that the magnification of a mask used in this embodiment is 4 times, the MEF value is 1.6 and ΔP is 2.2 [nm] at a hot spot No. 1. Therefore, a fluctuation in the resolution dimension on a waver is ΔLw=0.88 [nm], according to the MEF definition equation. It is known by the lithography simulation that when a mask is formed as designed, a pattern is resolved at 65 [nm] in an under-dose condition when a mask is exposed. Therefore, when the mask space dimension is fluctuated by +2.2 [nm], the dimension on a wafer is estimated to be 64.12 [nm] (in an easy-to-short direction).

As described above, an estimated resolution dimension at a hot spot on a wafer is obtained, and the order of potential to fail of the hot spot is re-arranged based on this estimated value. In the example of this embodiment, at a hot spot No. 23, the potential to fail is low in the mask designing stage, but according to the result of measurement of a critical dimension of a mask pattern, the difference from a design dimension is large, and MEF is also large. Therefore, as shown in FIG. 13, the hot spot No. 23 is shifted to a higher order.

As described above, the order of potential to fail of a hot spot is shifted by considering information about an actually formed mask pattern, in addition to hot spot information. Therefore, a hot spot to be managed can be accurately extracted, and the quality of a mask pattern can be efficiently and effectively insured.

Next, a mask pattern shape measuring spot is sampled based on the critical dimension error distribution obtained in step S40 (S41). Further, the shape of the sampled spot is measured based on the measuring spot information (S42, S43). In measurement of the shape, the contour of a mask pattern at the sampled spot (shape measuring spot) is measured. Concretely, the contour measurement is performed based on the contour points generated by the method described in the first, second or third embodiment. In this embodiment, based on the order of potential to fail including the measurement result of an actually formed mask pattern, a measuring spot is a hot spot where the estimated resolution dimension is lower than a predetermined threshold value (70 [nm] in this embodiment).

As an example, the measurement of the hot spot No. 23 in FIG. 13 will be explained. It is known from the hot spot information that the potential to fail is higher in an underexposure condition. Thus, in the lithography simulation in the shape measurement, comparison and judgment are performed with respect to the desired shape, by paying attention to a predictive wafer image in the underexposure condition. In this embodiment, a predictive wafer image is simulated when the amount of exposure is 0% and −5% to an appropriate exposure amount, and compared with a desired shape. As a result, the judgment is OK when the exposure amount is 0%, but the pattern is shorted when the exposure amount is −5%, and the judgment is NG. According to this result, a limit of exposure amount not causing a shape error when exposed by using the mask pattern is known, in addition to whether the mask pattern shape is OK or NG is known.

The information about a range of appropriate mask exposing condition obtained as above is transferred to a wafer process. In a wafer process, a mask can be used based on this information, and a hot spot can be managed through a wafer process.

As described above, in this embodiment, a spot of measuring a mask pattern shape is determined based on the information about a hot spot of a mask pattern and the information about a mask pattern actually formed on a photo mask. The information about a hot spot is usually obtained by lithography simulation. Therefore, when a mask pattern is actually formed on a photo mask, even a spot with high potential to fail may be regarded as a spot with low potential to fail. If such a spot is excluded from the shape measuring spot, a mask is not correctly evaluated (managed). In this embodiment, as the information about a mask pattern actually formed on a photo mask is also considered, in addition to the information about a hot spot of a mask pattern, a shape measuring spot can be correctly determined. Therefore, according to this embodiment, the quality of a photo mask can be correctly and effectively insured.

In the embodiment explained above, when a critical dimension error distribution is produced, the dimension measurement result in the mask quality check is used. In this case, in the lithography simulation in the mask data designing stage, a mask pattern dimension is used as a mask fabrication error factor, and a MEF value is calculated by lithography simulation. As a mask fabrication error factor, there are transmittance and phase difference of a phase shift mask, and a defect of a mask pattern, in addition to a mask pattern dimension. In such a case, fluctuations in the transmittance and phase difference of a phase shift mask, or a size of a defect of a mask pattern is input as a mask fabrication error factor, and the degree of influence on a resolution dimension on a wafer is estimated.

As for the spot where it is known from the shape measuring spot information that a pattern failure is caused by defocusing, a wafer image under defocusing is estimated by lithography simulation in the shape measurement, and the estimated image may be compared with a range of a desired shape. By obtaining a defocus limit not causing a shape error, and sending the obtained information to the wafer process, a hot spot can be managed through the wafer process.

Embodiment 5

A fifth embodiment of the invention will be explained hereinafter. The basic matters are the same as in the fourth embodiment, and explanations about these matters will be omitted.

Figure 14:
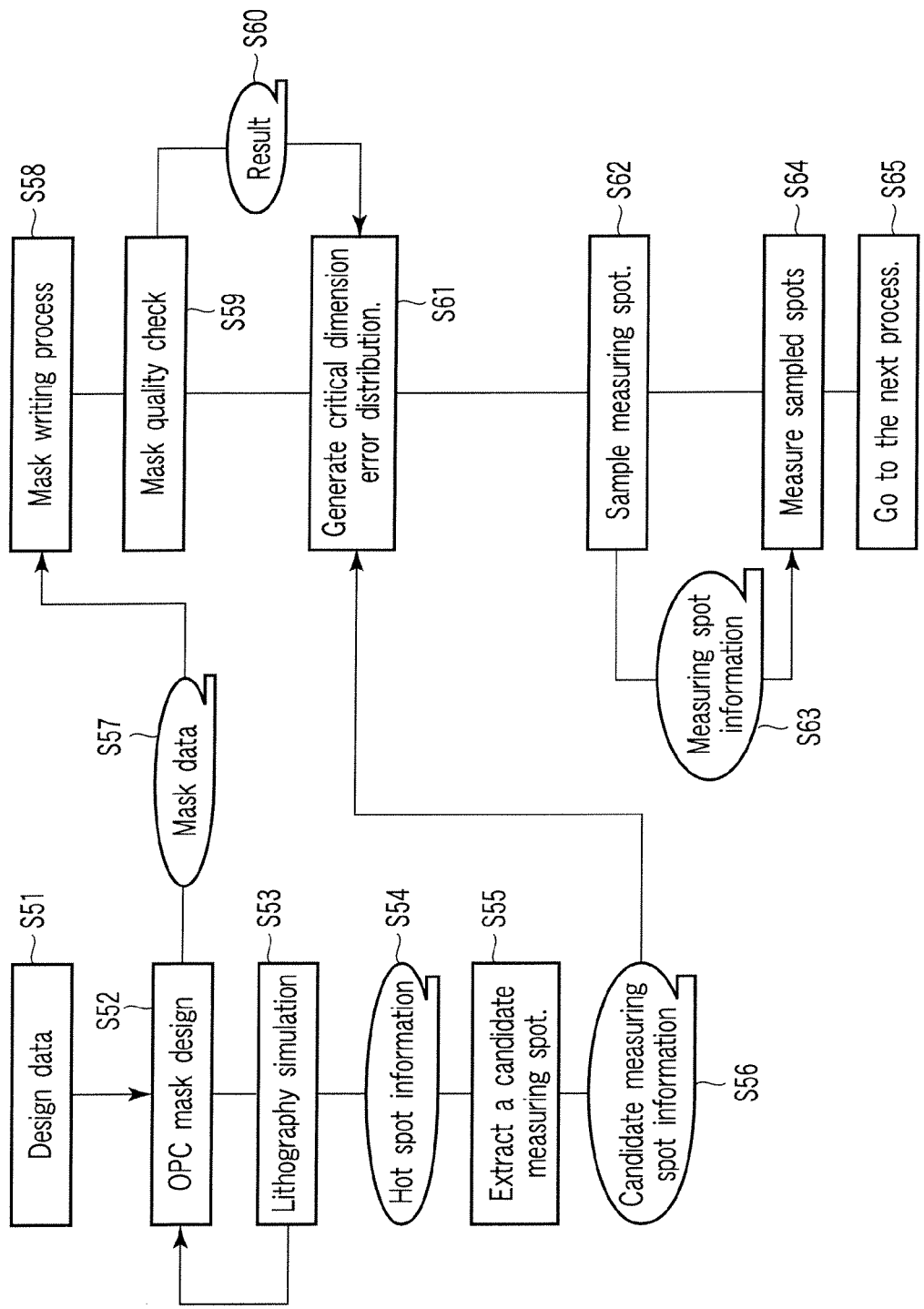
FIG. 14 is a flowchart showing a fifth embodiment of the invention.

FIG. 14 is a flowchart showing the fifth embodiment.

First, steps S51 to S54 are executed, and hot spot information is output (S54). The basic processes executed in steps S51 to S54 are the same as in the fourth embodiment. In the fifth embodiment, also, a hot spot is arranged in the order of potential to fail, as in the conventional hot spot information output. A hot spot is sampled based on a predetermined number from a highest-order spot or a preset hot spot threshold value. A sampled hot spot is sent to a mask forming process as a candidate measuring spot (S55, S56). In this embodiment, 12 hot spots are assumed to have been sampled as a candidate mask measuring spot.

As in the forth embodiment, steps S57 to S59 are executed, and a mask quality check is executed (S59). Critical dimension error distribution is produced based on the candidate measuring spot information obtained in step S56 and the mask quality check result obtained in steps 59 and S60 (S61). Concrete explanation will be given hereinafter.

Figure 15:
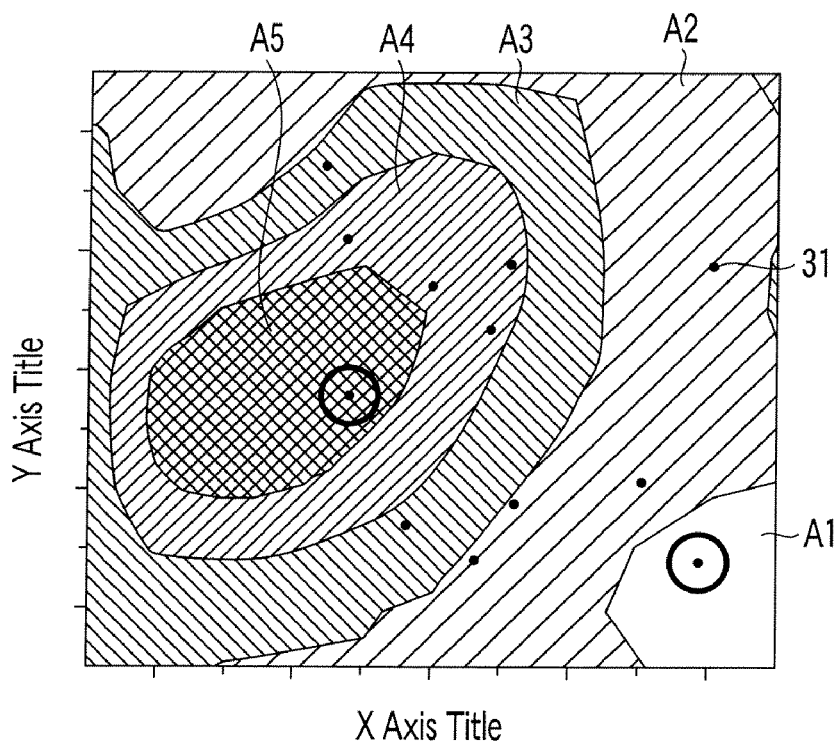
FIG. 15 is a diagram showing a variance of the difference between a critical dimension and a desired dimension, according to the fifth embodiment of the invention.

A dimension is measured at two or more spots on a photo mask to obtain critical dimension error distribution. In this embodiment, an optical dimension-measuring device is used, and 100 line patterns are selected as a measuring pattern. Based on the measurement result, obtain a variance in the difference between the critical dimension and desired dimension (e.g., mask design dimension). FIG. 15 is a diagram showing the variance distribution of the difference ($\Delta P$ described in the first embodiment) between the critical dimension and desired dimension in the mask. The area A1 is an area where the value of $\Delta P$ described in the first embodiment is in a range of −8.0 to −4.8. The area A2 is an area where the value of $\Delta P$ is in a range of −4.8 to −1.6. The area A3 is an area where the value of $\Delta P$ is in a range of −1.6 to +1.6. The area A4 is an area where the value of $\Delta P$ is in a range of +1.6 to +4.8. The area A5 is an area where the value of $\Delta P$ is in a range of +4.8 to +8.0. In this embodiment, the variance $3\sigma$ is ±7.8 [nm].

The sampled 12 mask measuring candidate spots (shape measuring spots sampled in the mask data designing stage) and the above-mentioned variance distribution are overlapped. As seen from FIG. 15, two out of 12 candidate measuring spots are positioned in the area (A1 and A5) where the difference between the critical dimension and desired dimension is large. Therefore, in this embodiment, these two spots are used as shape measuring spots. Namely, these two spots are sampled as a shape measuring spot (S62).

Next, the shape of a mask pattern is measured based on the measuring spot information obtained in step S62 (S63, S64). In this embodiment, a mask pattern image is obtained by an image acquisition apparatus with respect to two spots sampled in step S62. A SEM capable of acquiring a high-resolution image is used as an image acquisition apparatus. The contour of the image obtained by the SEM is sampled at each measuring spot.

By using the extracted contour data, lithography simulation is performed and a predictive image on a wafer is output. Whether the obtained predictive image is within a range of a desired shape is judged. In this embodiment, it is appreciated that one of the two measuring spots is out of the desired range. By narrowing down a pattern to be managed, the measured mask can be judged to be out of specifications in a least necessary time.

As described above, also in this embodiment as in the fourth embodiment, a mask pattern shape measuring spot is determined based on the information about a hot spot on a mask pattern and the information about a mask pattern actually formed on a photo mask. Therefore, as in the fourth embodiment, a shape measuring spot can be correctly determined, and the photo mask quality can be correctly and effectively insured.

Embodiment 6

A sixth embodiment of the invention will be explained hereinafter. The basic matters are the same as in the fourth and fifth embodiments, and explanations about these matters will be omitted.

As in the fifth embodiment, steps S51 to S61 are executed. Based on the result of measuring mask dimensions, an average value and variance of the difference between a critical dimension and a desired dimension are obtained. As a result, an average value is +3.0 [nm], a variance $3\sigma$ is ±7.8 [nm]. Both the average value and variance satisfies the specifications of this product, but as a whole mask, the pattern dimensions are set larger. Concretely, a mask pattern is made at −3% underexposure, converted to the amount of exposure.

FIG. 16 shows information about candidate spots of measuring the shape of a photo mask pattern extracted in the mask data designing stage. This shape measuring spot information includes a pattern failure category, in addition to coordinates (X, Y). Namely, the information includes a pattern failure category indicating a pattern failure likely to occur when a fluctuation occurs in the exposure amount and focus upon exposure of a mask.

It is known that a mask in this embodiment is manufactured on an underexposure side, when the dimension measurement result is converted to the amount of exposure. In the example of FIG. 16, the potential to fail of a pattern likely to short is enhanced in the under-dose condition No. 1. Therefore, measurement is made at a spot likely to cause a shape error in an underexposure condition. A spot likely to become a hot spot on a wafer can be effectively selected.

In this embodiment, the case that an average value of a critical dimension is fluctuated to the underexposure side is described. If an average value of a critical dimension is fluctuated to the overexposure side, a spot likely to cause a shape error in an overexposure condition is to be selected.

As described above, also in this embodiment as in the fourth and fifth embodiments, a shape measuring spot can be correctly determined, and the photo mask quality can be correctly and effectively insured.

Embodiment 7

A seventh embodiment of the invention will be explained hereinafter. The basic matters are the same as in the fourth and fifth embodiments, and explanations about these matters will be omitted.

FIG. 17 is a flowchart showing the seventh embodiment.

First, steps S71 to S74 are executed, and hot spot information is generated (S74). The basic processes executed in steps S71 to S74 are the same as in the fourth embodiment. In the seventh embodiment, also, a hot spot is arranged in the order of potential to fail.

As in the fourth embodiment, steps S75 and S76 are executed, and a photo mask is formed (S76). A mask quality check is executed for the formed photo mask. Based on the result of the mask quality check, critical dimension error distribution is produced (S78, S79). Concrete explanation will be given hereinafter.

In dimension measurement in the mask forming process, dimensions are measured at two or more spots on a photo mask by using a dimension-measuring device, based on previously specified dimension management pattern data. Based on the result of this measurement, an average value and variance of the difference between a critical dimension and a desired dimension is obtained. Whether a mask is acceptable is checked, and critical dimension error distribution is obtained. Concretely, as in the fourth embodiment, the difference $\Delta P$ between a critical dimension and a design dimension is obtained for each of dimension measuring spots. Distribution of $\Delta P$ is obtained as a function of the XY coordinates on the mask surface. Namely, obtain the following equation.

$$\Delta p = f(X, Y)$$

In the case of a phase shift mask, transmittance and phase difference are measured at two or more spots on a photo mask, according to previously specified transmittance/phase difference management pattern data. Based on the result of this measurement, whether a mask is acceptable is checked, and transmittance distribution and phase distribution of a mask phase shifter are obtained. For example, as well as critical dimension error distribution, distribution of transmittance T and phase difference φ is obtained as a function of the XY coordinates on the mask surface. Namely, obtain the following equation.

$$T = g(X, Y)$$

$$\phi = h(X, Y)$$

Then, a shape check process is taken place, and a shape check is performed by comparing a mask pattern and mask data. By this shape check, information such as coordinates of a detected defect, kinds of a defect such as a lack and residue of a pattern, and shapes of a defect, is output. The critical dimension error distribution in the shape check process is generated as pattern graphic data, based on the image data obtained by the shape check device upon detection of a defect. The pattern graphic data includes information about mask pattern shape, including coordinates of a defect, kinds of a defect, and detected defects.

As descried above, critical dimension error distribution is obtained from three kind of the mask quality check. Mask data including critical dimension error distribution is generated from the critical dimension error distribution and mask design data (S80).

First, an explanation will be given on generation of mask data by using hot spot information sent from the mask design process. Mask design data is cut out from a certain area used by lithography simulation, taking the coordinates of a hot spot of the hot spot information as a center. For the cut-out mask data of each hot spot, mask data including previously obtained critical dimension error distribution ΔP, transmittance distribution T, and phase distribution φ is generated.

Based on the result of lithography simulation of the generated mask data of each hot spot, a shape-measuring pint is sampled (S81, S82, S83, S84). Concretely, rearrangement in the order of potential to fail is performed based on the result of lithography simulation, and a shape measuring spot is sampled based on a predetermined number from a highest-order spot, or a preset hot spot threshold value. And, a shape is measured based on the measuring spot information (S85, S86).

In a shape measuring process, as in the fourth and fifth embodiments, a mask pattern image at the sampled measuring spot is obtained, and the contour of the obtained image is extracted. Further, lithography simulation is performed by using the contour data, and an image on a wafer is predicted. Whether the predicted image on a wafer is within a range of a desired shape is checked, and thereby, whether a mask is acceptable is judged. When a mask is judged acceptable, the next process will be taken place.

Next, an explanation will be given on the case that mask data is generated including critical dimension error distribution obtained by a shape check. Mask design data is cut out from a certain area used by lithography simulation, taking the coordinates of a detected defect as a center. For the cut-out mask data of each defect, pattern graphic data that is critical dimension error distribution in the shape check process is synthesized. Further, previously obtained critical dimension error distribution ΔP, transmittance distribution T, and phase distribution φ are generated.

Lithography simulation is performed for the mask data of each defect generated as described above. Based on the result of lithography simulation of each defect, whether the detected defect needs correction is judged. For a defect judged to be corrected, correction is made. When correction is not needed, the next process will be taken place.

As described above, in this embodiment, mask data including critical dimension error distribution ΔP, transmittance distribution T and phase distribution φ is generated, and potential to fail of each hot spot is estimated, and then a shape measuring spot is sampled. Therefore, it is possible to manage a hot spot considering an actually formed mask. Further, mask data including a defect detected in the shape check process is generated, and lithography simulation of a defect is performed. Therefore, it is possible to check whether a defect needs correction before correction, and only a part needing correction can be corrected.

If a mask is judged defective in the shape measuring process, though it satisfies required specifications in the acceptance check in the dimension measuring process and transmittance/phase difference measuring process of a phase shifter, the measurement result may be fed back to the design process or OPC mask design process. In this case, based on the result obtained in the shape measuring process, a hot spot in the design data or OPC mask data is corrected. Or, when a mask is judged to be adjustable in the mask forming process, a mask may be re-formed by tuning adjustable process parameters, such as amount of writing dose, developing time and etching time.

As described above, also in this embodiment as in the fourth and fifth embodiments, a shape measuring spot can be correctly determined, and the photo mask quality can be correctly and effectively insured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern verifying method comprising:
obtaining first information about a hot spot from design data of a mask pattern, the hot spot having a small lithography process latitude;
obtaining second information about the mask pattern actually formed on a photo mask; and
determining a measuring spot of the mask pattern actually formed on the photo mask, based on the first and second information.

2. The method according to claim 1, wherein the hot spot is obtained by simulation.

3. The method according to claim 1, wherein the measuring spot is selected from the hot spots.

4. The method according to claim 1, wherein the first information includes position information of the hot spot.

5. The method according to claim 1, wherein the first information includes information about a pattern failure category at the hot spot.

6. The method according to claim 1, wherein the first information includes information about MEF at the hot spot.

7. The method according to claim 1, wherein the second information includes information about dimensions of the mask pattern actually formed on the photo mask.

8. The method according to claim 1, wherein the second information includes information about a dimensional difference between a target pattern and the mask pattern actually formed on the photo mask.

9. The method according to claim 1, wherein the photo mask includes a phase shift mask, and
the second information includes information about at least one of phase difference and transmittance of the phase shift mask.

10. The method according to claim 1, further comprising generating information about a shape of the mask pattern at the measuring spot.

11. The method according to claim 1, further comprising generating information about a contour of the mask pattern at the measuring spot.

12. The method according to claim 11, wherein generating the information about the contour includes:
obtaining an image of the mask pattern actually formed on the photo mask;
matching the image of the mask pattern with a reference pattern;
setting reference points on a contour of the reference pattern at intervals according to a distance from a vertex of the reference pattern; and
outputting contour points of the image of the mask pattern at positions defined by the reference points.

13. The method according to claim 12, wherein the reference pattern is obtained from mask design data or mask writing shot data.

14. The method according to claim 11, wherein generating the information about the contour includes:
obtaining an image of the mask pattern actually formed on the photo mask;
matching the image of the mask pattern with a reference pattern;
setting reference points on a contour of the reference pattern at intervals according to a distance between the contour of the image of the mask pattern and the contour of the reference pattern; and
outputting contour points of the image of the mask pattern at positions defined by the reference points.

15. The method according to claim 14, wherein the reference pattern is obtained from mask design data or mask writing shot data.

* * * * *